US012656207B2

(12) United States Patent (10) Patent No.: US 12,656,207 B2

Wetzel (45) Date of Patent: Jun. 16, 2026

(54) CUSTOMIZABLE VACUUM TEST SYSTEMS AND METHODS

(71) Applicant: Blue Origin Manufacturing, LLC, Huntsville, AL (US)

(72) Inventor: Eric David Wetzel, Seattle, WA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 301 days.

(21) Appl. No.: 18/515,924

(22) Filed: Nov. 21, 2023

(65) Prior Publication Data

US 2024/0167908 A1 May 23, 2024

Related U.S. Application Data

(60) Provisional application No. 63/384,724, filed on Nov. 22, 2022.

(51) Int. Cl.
G01M 3/26 (2006.01)
G01M 3/04 (2006.01)
H05K 5/06 (2006.01)

(52) U.S. Cl.
CPC ............... G01M 3/26 (2013.01); G01M 3/04 (2013.01); H05K 5/065 (2013.01); H05K 5/069 (2013.01)

(58) Field of Classification Search
None
See application file for complete search history.

(56) References Cited

U.S. PATENT DOCUMENTS

| | | | |
|---|---|---|---|
| 4,696,186 A | 9/1987 | Sharp | |
| 5,400,646 A | 3/1995 | Kraus et al. | |
| 6,551,024 B1 | 4/2003 | Berg et al. | |
| 8,047,058 B2 * | 11/2011 | Caps | G01M 3/002 73/49.3 |
| 11,143,571 B2 | 10/2021 | Wetzig | |

FOREIGN PATENT DOCUMENTS

| | | | |
|---|---|---|---|
| CN | 110068430 A | 7/2019 | |
| CN | 111141246 A * | 5/2020 | G01L 9/12 |
| CN | 211927209 U | 11/2020 | |
| DE | 202018105649 U1 | 1/2020 | |
| KR | 101019043 B1 | 3/2011 | |
| KR | 101335699 B1 | 12/2013 | |
| RU | 2172479 C2 | 8/2001 | |

* cited by examiner

*Primary Examiner* — Peter J Macchiarolo
*Assistant Examiner* — Jermaine L Jenkins
(74) *Attorney, Agent, or Firm* — Knobbe, Martens, Olson & Bear, LLP

(57) ABSTRACT

Systems and methods for customizable vacuum testing chambers. Outer shell segments are assembled to conform to and form a sealed enclosure about a test article having air therein. An interstitial region is defined between the test article and the shell segments. A porous support layer is located within the interstitial region. A vacuum pump evacuates air from within the interstitial region to vacuum test the article. Sensors detect leaks within the interstitial region. Zonal barriers may fluidly isolate zones of the interstitial region for locating leaks. The shell segments may be disassembled and the test article removed. The shell segments may be reused for testing other test articles having different shapes and sizes.

17 Claims, 6 Drawing Sheets

CUSTOMIZABLE VACUUM TEST SYSTEMS AND METHODS

CROSS-REFERENCE TO RELATED APPLICATIONS

Any and all applications for which a foreign or domestic priority claim is identified in the Application Data Sheet as filed with the present application are hereby incorporated by reference under 37 CFR 1.57. For example, this application claims the benefit of priority to U.S. Provisional Application No. 63/384,724 titled "CUSTOMIZABLE VACUUM TEST SYSTEMS AND METHODS" and filed Nov. 22, 2022, the entire disclosure of which is hereby incorporated by reference herein in its entirety for all purposes and forms a part of this specification.

BACKGROUND

Field

The technology relates generally to vacuum testing, in particular to customizable vacuum test systems that may be assembled and disassembled about a test article.

Description of Related Art

Vacuum testing is used to evacuate air and create a vacuum around a test article to test for leaks of the pressurized air from within the test article. Conventional vacuum testing uses very large, fixed volume chambers, so that many different sizes of test articles can fit inside the same chamber. This results in large amounts of excess space around the test article inside the chamber. Conventional vacuum test systems thus require evacuating large volumes of air, which adds complexity to such systems, such as requiring large pumps, high electrical power demands to operate the pumps, and up to days of pump-down time before tests can begin. Conventional test chambers further require thick, heavy, structural chamber walls that are immobile and housed in a dedicated facility in a fixed location. Thus, the test article must be built at or brought to the location of the chamber, which can increase expense and time delay, for instance for transportation, or on-site building, etc. There is a need therefore for improvements to these and other drawbacks of existing vacuum testing technology.

SUMMARY

The embodiments disclosed herein each have several aspects no single one of which is solely responsible for the disclosure's desirable attributes. Without limiting the scope of this disclosure, its more prominent features will now be briefly discussed. After considering this discussion, and particularly after reading the section entitled "Detailed Description," one will understand how the features of the embodiments described herein provide advantages over existing systems, devices, and methods for vacuum testing.

The following disclosure describes non-limiting examples of some embodiments. For instance, other embodiments of the disclosed systems and methods may or may not include the features described herein. Moreover, disclosed advantages and benefits may apply only to certain embodiments of this disclosure and should not be used to limit the disclosure.

Systems, devices, and methods for customizable vacuum testing are described. Outer shell segments may be assembled to conform to, and form a sealed enclosure about, a test article having air therein. An interstitial region may be defined between the test article and the shell segments. A porous support layer may be located within the interstitial region. A vacuum pump may evacuate air from within the interstitial region to vacuum test the article. Sensors may detect leaks within the interstitial region. Zonal barriers may fluidly isolate zones of the interstitial region for locating leaks. The shell segments may be disassembled and the test article removed. The shell segments may be reused for testing other test articles having different shapes and sizes Various aspects, each having various embodiments thereof, are described. In one aspect, a customizable vacuum test system is described. The system comprises a plurality of outer shell segments, an interstitial region, a porous layer, and a pump. The plurality of outer shell segments each have an inner surface and an opposite outer surface. The plurality of outer shell segments are configured to be assembled together, to conform to a shape of a test article and form a sealed enclosure about the test article, and to be disassembled from each other. The interstitial region is defined between an outer side of the test article and the inner surface of the plurality of outer shell segments when the plurality of outer shell segments form the sealed enclosure about the test article. The porous layer is configured to be located within the interstitial region and to support the inner surface of one or more of the plurality of outer shell segments against an outer side of the test article when the plurality of outer shell segments form the sealed enclosure about the test article. The pump is in fluid communication with the interstitial region and configured to evacuate air from within the interstitial region to create a vacuum in the interstitial region.

Various embodiments of the various aspects may be implemented. In some embodiments, the plurality of outer shell segments are configured to be welded together when assembled to form the sealed enclosure. In some embodiments, the system further comprises a seal configured to extend along opposing outer edges of two adjacent shell segments of the plurality of outer shell segments. In some embodiments, the porous layer comprises a honeycomb configuration. In some embodiments, the system further comprises one or more sensors configured to detect a change in pressure in the interstitial region. In some embodiments, the system further comprises one or more zonal barriers configured to define two or more zones within the interstitial region that are fluidly isolated from each other. In some embodiments, the system further comprises a sensor positioned in one or more of the fluidly isolated zones configured to detect a leak of air from within the test article to the respective fluidly isolated zone. In some embodiments, the sealed enclosure is configured to provide a volume that is no more than 130% of a volume occupied by the test article. In some embodiments, the sealed enclosure does not include a door. In some embodiments, the vacuum comprises a pressure no greater than 1 psi.

In another aspect, a method of vacuum testing an article is provided. The method comprises attaching a plurality of shell segments to form a sealed enclosure about the test article, wherein test article comprises a volume of air therein, positioning a porous support structure in an interstitial region defined between the test article and an inner side of the sealed enclosure, generating a vacuum within the interstitial region, detecting a change in pressure in the interstitial region with one or more sensors, determining whether the volume of air is leaking from the test article, and detaching one or more of the plurality of shell segments from each other so that the test article may be removed.

Various embodiments of the various aspects may be implemented. In some embodiments, attaching the plurality of shell segments comprises welding the plurality of shell segments together. In some embodiments, attaching the plurality of shell segments comprises substantially conforming the sealed enclosure to an outer shape of the test article. In some embodiments, the method further comprises fluidly isolating one or more zones of the interstitial region with a zonal barrier. In some embodiments, the method further comprises determining whether the volume of air is leaking from the test article into the one or more zones. In some embodiments, the sealed enclosure forms a volume that is no more than 130% of a volume occupied by the test article. In some embodiments, the method further comprises positioning the plurality of shell segments about the test article such that an average distance between inner surfaces of the plurality of shell segments and respective opposing outer surfaces of the test article is no more than 10 inches.

In another aspect, a customizable vacuum test system is provided. The system comprises a plurality of outer shell segments, a porous layer, and a vacuum pump. Each outer shell segment is configured to be removably attached to one or more of the other outer shell segments to form an enclosure about a test article, wherein the enclosure forms a volume that is no more than 130% of a volume occupied by the test article. The porous layer is configured to be positioned between the plurality of outer shell segments and the test article to structurally support the plurality of outer shell segments. The vacuum pump is configured to create a vacuum within the porous layer.

Various embodiments of the various aspects may be implemented. In some embodiments, the system further comprises one or more zonal barriers configured to define two or more fluidly isolated zones between the enclosure and the test article. In some embodiments, an average distance between an inner surface of each shell segment and a respective opposing outer surface of the test article is no more than 10 inches.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made without departing from the spirit or scope of the subject matter presented here. It will be readily understood that the aspects of the present disclosure, as generally described herein, and illustrated in the drawings, may be arranged, substituted, combined, and designed in a wide variety of different configurations, all of which are explicitly contemplated and make part of this disclosure.

DETAILED DESCRIPTION

Figures 1A, 1B:
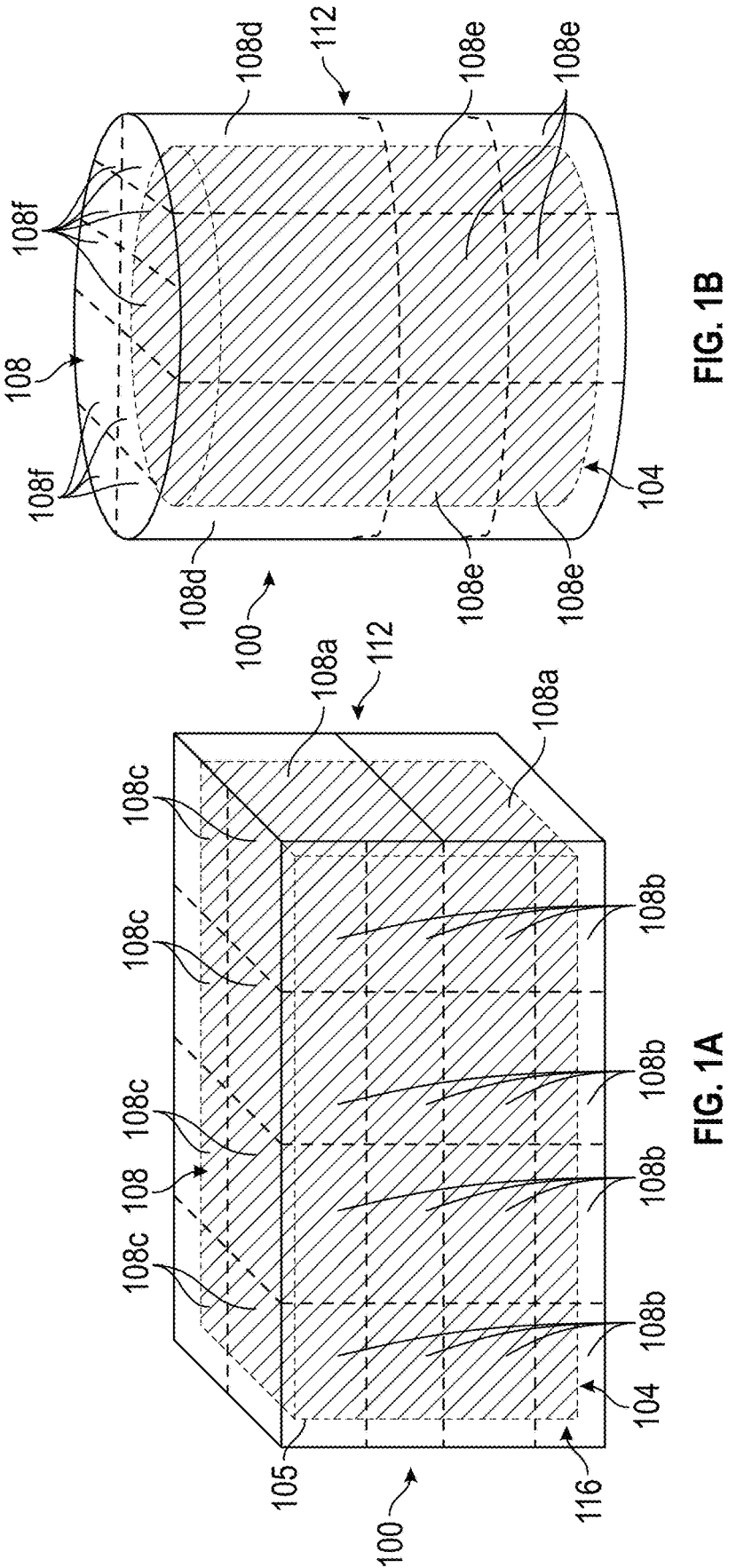
FIGS. 1A and 1B are perspective schematic views of various embodiments of customizable vacuum test systems enclosing test articles and having various shapes and sizes.

The following detailed description is directed to certain specific embodiments for devices, systems, and methods related to customizable vacuum testing. In this description, reference is made to the drawings wherein like parts or steps may be designated with like numerals throughout for clarity. Reference in this specification to "one embodiment," "an embodiment," or "in some embodiments" means that a particular feature, structure, or characteristic described in connection with the embodiment is included in at least one embodiment of the invention. The appearances of the phrases "one embodiment," "an embodiment," or "in some embodiments" in various places in the specification are not necessarily all referring to the same embodiment, nor are separate or alternative embodiments necessarily mutually exclusive of other embodiments. Moreover, various features are described which may be exhibited by some embodiments and not by others. Similarly, various requirements are described which may be requirements for some embodiments but may not be requirements for other embodiments. Reference will now be made in detail to embodiments of the invention, examples of which are illustrated in the accompanying drawings. Wherever possible, the same reference numbers will be used throughout the drawings to refer to the same or like parts.

A pressure or vacuum test is typically performed on a sealed pressure vessel, such as a space station module, in a large, one-size-fits-all vacuum chamber. The chamber is used to verify pressure integrity and to detect any leaks that require redesign or repair. Leaks in a sealed pressure vessel can occur from manufacturing flaws or inadequate seals around penetrations such as hatches or windows. In some cases, leaks can be fatal. An example pressure vessel includes a large human habitable enclosure for use in space.

Currently, leak tests are completed in a very large chamber defining a large vacuum insertion space inside the large vacuum chamber to accommodate a wide variety of pressure vessel sizes and shapes. This requires a large volume of air to be evacuated, necessitating complicated and expensive test processes, and which restricts the location of the testing site. In addition, if the article leaks, the location of the leak is not easy to find, and further the defective enclosure (e.g., space station module) needs to be removed, repaired, and reentered into the test chamber to repeat the process, necessitating repeated generations of the vacuum test where a large volume of air needs to be re-evacuated in the chamber in the insertion space surrounding the repaired test article. The fixed location of the conventional large testing chamber imposes cost and time constraints on the building and testing of the pressure vessel as well.

The customizable vacuum test systems and methods according to the present disclosure provide many benefits and advantages over existing approaches. For example, the custom-build chambers described herein simplify the test set up, which reduces cost and time to test and, if needed, to repair test articles. The conformable nature of the custom chamber results in a smaller volume requiring vacuum, allowing for smaller pumps requiring less energy to be used, and less time to pull the vacuum as well. The "on-demand" nature of the custom chamber allows for building the chamber and testing the article in locations regardless of proximity to dedicated test chamber facilities and prevents the need to transport the test article to a dedicated test site. Additionally, the custom chamber provides enhanced safety by minimizing the amount of stored energy in the custom test facility.

FIGS. 1A and 1B are schematic perspective views of various embodiments of customizable vacuum test systems 100 enclosing test articles 104 therein. FIG. 1A depicts an embodiment of the system 100 for testing a six-sided, box-shaped test article 104. FIG. 1B depicts an embodiment of the system 100 for testing a cylindrical test article 104. The systems 100 conform to and thus mimic the shape and outer contour of the respective test article 104 that is inside the system 100.

As shown, in FIGS. 1A and 1B, the systems 100 may include a plurality of outer shell segments 108. The segments 108 of the system 100 in FIG. 1A comprise first segments 108a, second segments 108b, and third segments 108c. The segments 108 of the system 100 in FIG. 1B comprise first segments 108d, second segments 108e, and third segments 108f. There may be at least two, at least three, at least four, at least five, at least six, at least seven, at least eight, at least nine, at least ten, at least fifteen, at least twenty, at least fifty, or more total segments 108. The segments 108 may be sheets, where the length and width of an individual segment 108 is much larger than the transverse thickness of the segment 108, e.g., two, five, ten, or twenty or more times as large as the thickness.

The segments 108 are shown assembled to form an enclosure 112 about the test article 104. The segments 108 may be assembled such that the enclosure 112 generally conforms to the outer shape of the test article 104 and defines a gap therebetween. When assembled, the segments 108 may provide an enclosure 112 that may be sealed and prevents air from escaping, as described in further detail below. In some embodiments, the enclosure 112 may not include a door. The segments 108 may be formed of metal, for example mild steel, and may be metal sheets.

FIG. 1A depicts the segments 108 assembled to form six, flat sides, with pairs of flat sides positioned across from each other to form a generally rectangular shape. FIG. 1B depicts the segments 108 assembled to form two flat opposing sides with a curved sidewall therebetween resulting in a generally cylindrical shape. While rectangular and cylindrical test articles 104 (and correspondingly shaped system 100) are shown, the test articles 104 (and corresponding system 100) may have any outer shape, such as rectangular, cylindrical, cubic, elongated, flat, polygonal, other shapes, or combinations thereof. There may be protrusions or indentations of these and other outer shapes of the system 100.

The segments 108 may vary in size. The sizes of the segments 108 may depend upon the outer shape of the test article 104. For example, as shown in FIG. 1A, the segment 108a may be larger than (e.g., larger surface area and/or dimensions) segment 108c, both of which may be larger than segment 108b. Similarly, as shown in FIG. 1B, the segment 108d may be larger than segment 108e, both of which may be larger than segment 108f. In some embodiments, the segments 108 may all be identical or substantially identical sizes. In some embodiments, some of the segments 108 may be the same size and some may vary in size.

Further, the shapes of each individual segment 108 may vary. The shapes of the segments 108 may depend upon the outer shape of the test article 104. The segments 108 may be four-sided rectangular shapes as in FIGS. 1A and 2A. In other embodiments, the segments 108 may be three-sided, five-sided, six-sided, rectangular, square, triangular, trapezoidal, other polygonal shapes, irregular shapes, or combinations thereof. In some embodiments, the segments 108 may all be identical shapes. In some embodiments, the segments 108 may vary in shape. The segments 108 may each have a maximum dimension (e.g., length or width) that is no greater than 1 foot, no greater than 2 feet, no greater than 3 feet, no greater than 4 feet, no greater than 5 feet, no greater than 6 feet, no greater than 7 feet, no greater than 8 feet, no greater than 9 feet, or no greater than 10 feet.

The contour of an individual segment 108 may be planar, curved, have protrusions, have indentations, or a combination thereof. For example, the test article 104 of FIG. 1B may include some segments 108 with a radiused curvature (such as segments 108d, 108e) while the test article 104 of FIG. 1A may only include planar segments 108. The sealed enclosure 112 or test chamber formed by the segments 108 may include segments 108 that are only planar, may include segments 108 that have a curvature or other contour, or may include a combination thereof.

In some embodiments, the segments 108 may be sized and shaped such that they are as flat as possible while still capable of being assembled to enclose a test article 104 that has an outer shape with various curvatures. This may result in the segments 108 having a smaller overall size and/or simplify the construction process. In some embodiments, the test article 104 may have a relatively simple outer shape (e.g., no curvatures) allowing for fewer larger segments 108 to be used to form the enclosure 112. Some test articles 104 may include a combination of segments 108 having a smaller overall size and segments 108 having a larger overall size.

As described in further detail below, the segments 108 may be assembled about the test article 104 and attached together. The segments 108 may be assembled together to form the enclosure 112. For example, as shown in FIG. 1A, edges of the segments 108c may be attached or joined with adjacent edges of the segments 108a, 108b, etc. Non-limiting examples of assembling include welding and/or bolting a first segment 108 to one or more adjacent segments 108. In some embodiments, the segments 108 may be mechanically coupled. For example, the segments 108 may be attached using bolts, adhesive, brackets, clips, bands, other suitable means, welding, or combinations thereof. The adjacent segments 108 may be positioned such that a side edge of the first segment 108 abuts a side edge of the second segment 108. The adjacent segments 108 may be positioned such that there is an overlap between the first and second segments 108. In some embodiments, a seal 107 may be positioned around an outer edge or perimeter of one or more of the segments 108, as shown in and described in further detail with respect to FIG. 2A. For example, the seal 107 may be located between adjacent segments 108c and the segments 108a, 108b, etc.

Figure 3:
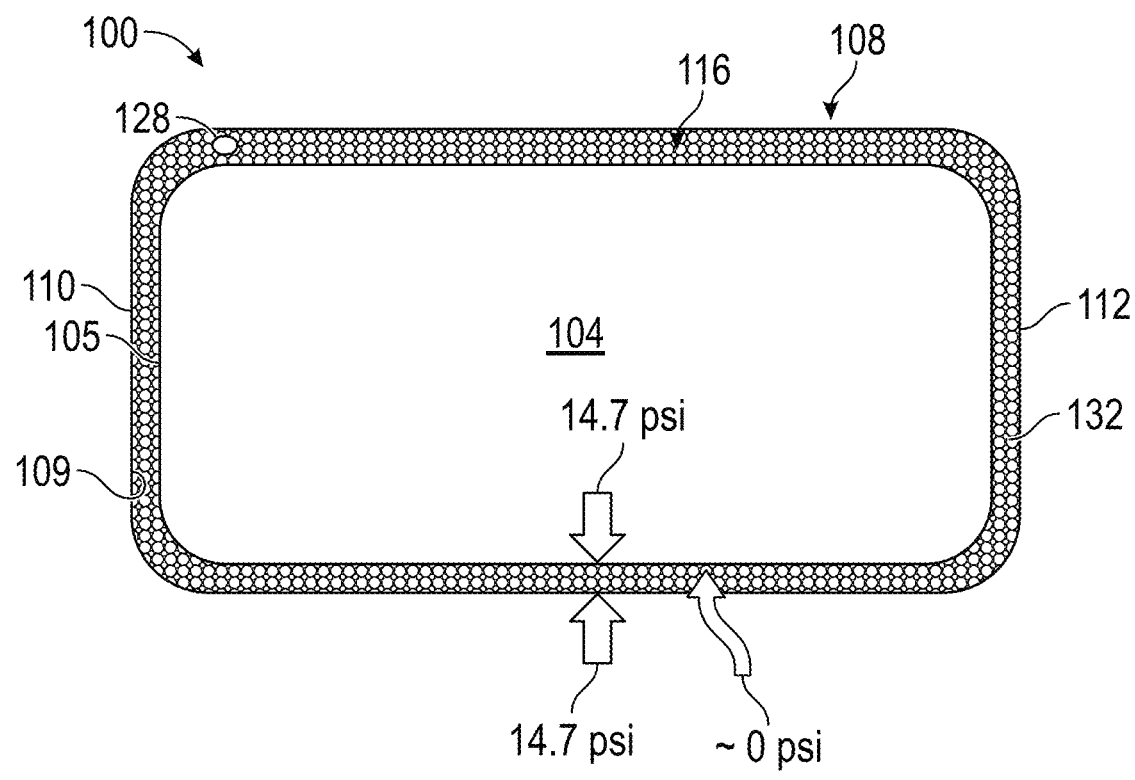
FIG. 3 is a cross-sectional schematic view of an embodiment of a customizable vacuum test system having rectangular cross-section with an interstitial region and porous layer located within the interstitial region.
Figure 4:
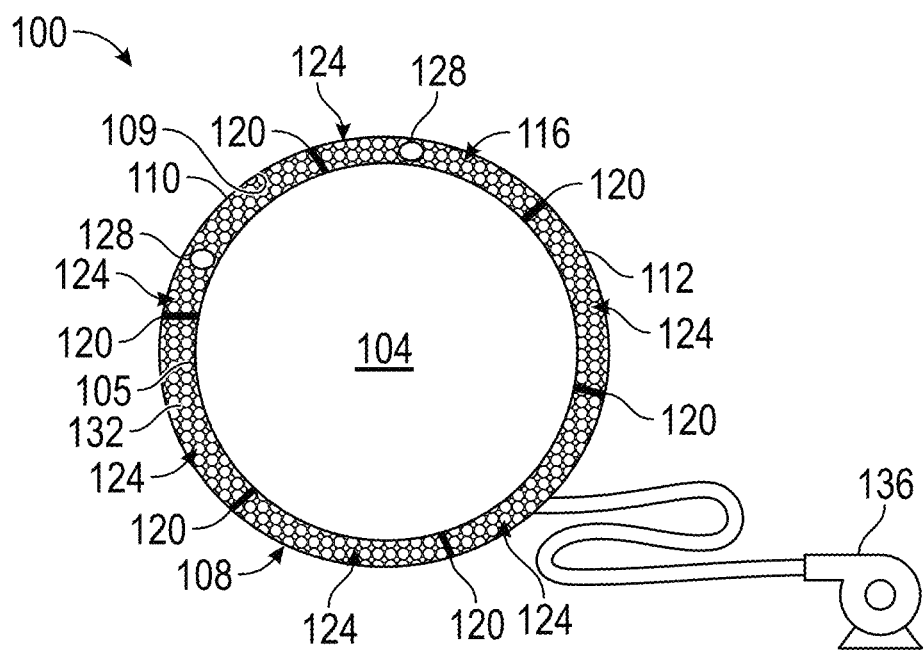
FIG. 4 is a cross-sectional schematic view of an embodiment of a customizable vacuum test system having cylindrical cross-section and zonal barriers within an interstitial region.

The systems 100 may define an interstitial region 116 between the inner surfaces 109 of the segments 108 and outer surfaces 105 of the test article 104, as further described herein, for example with respect to FIGS. 3 and 4. The interstitial region 116 may include porous material for structural support and/or barriers to form isolation zones to facilitate leak detection and locating, as further described herein, for example with respect to FIGS. 3 and 4.

Figure 2A:
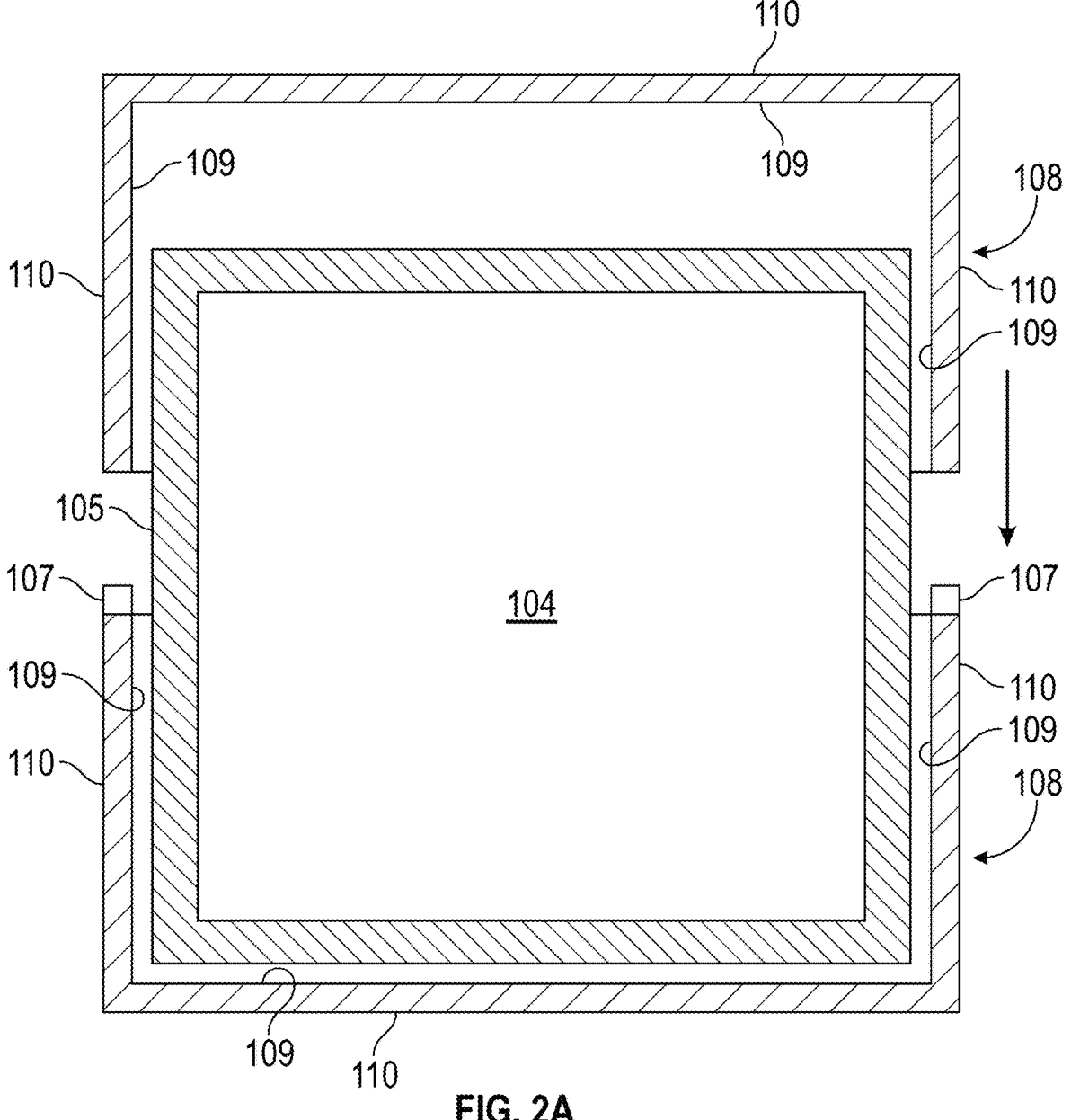
FIGS. 2A-2C are cross-sectional schematic views of various embodiments of customizable vacuum test systems being assembled about test articles having various outer shapes.
Figure 2B:
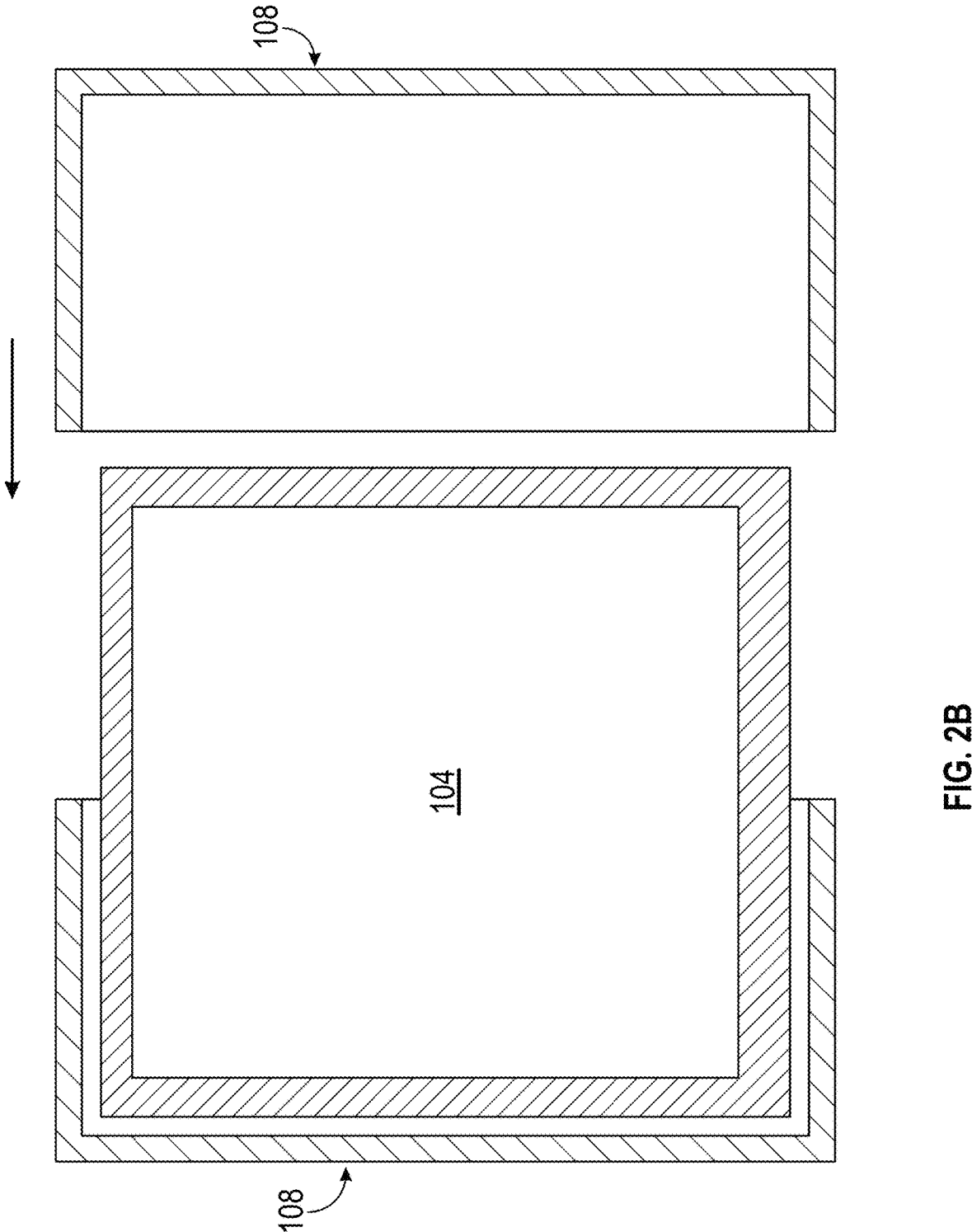
Figure 2C:
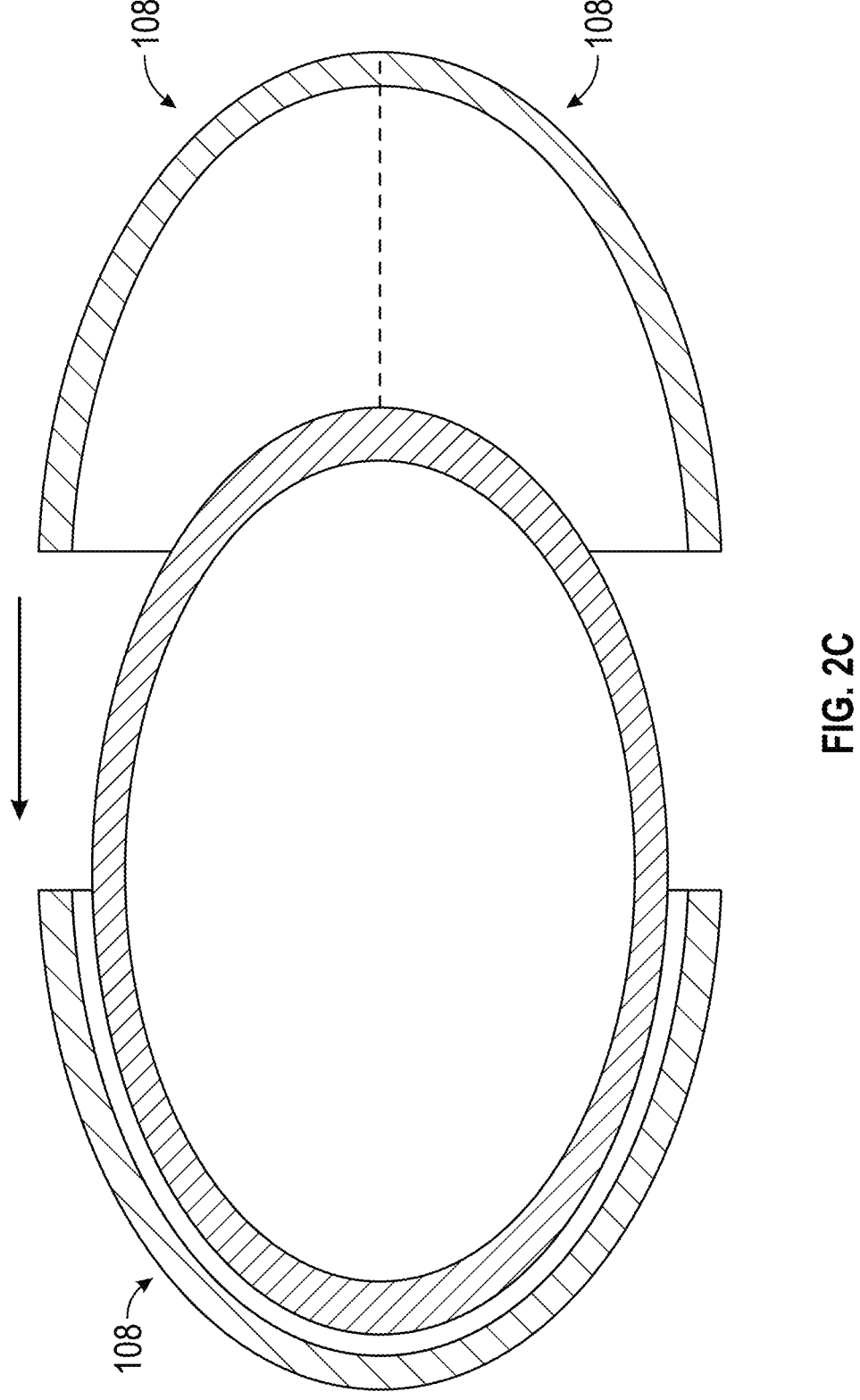

FIGS. 2A-2C are cross-sectional schematic views of various embodiments of customizable vacuum test systems being assembled about test articles having various outer shapes. The figures illustrate example methods of assembling segments 108 about or around a test article 104.

FIGS. 2A and 2B show a box-like enclosure 112 being formed over a correspondingly-shaped test article 104 by joining segments 108. The segments 108 may each have one or more inner surfaces 109 and one or more outer surfaces 110. The one or more outer surfaces 110 may be located opposite the respective inner surface 109. The inner surface 109 may face toward the test article 104. The thickness of the segment 108 may be measured perpendicularly from the inner surface 109 to the outer surface 110. The thickness may be no greater than 0.0625 inch, no greater than 0.125 inch, no greater than 0.25 inch, no greater than 0.375 inch, no greater than 0.5 inch, or no greater than 0.1 inch.

As shown in FIG. 2A, the system 100 may include one or more seals 107. The seal 107 may be a rubber seal or a gasket. The seal 107 may extend along the interface between adjacent segments 108, for example on an inner and/or outer side of the segments 108, and/or in a gap defined between the adjacent segments 108. There may be seals 107 between some, none, or all of the segments forming an enclosure 112. The seal 107 may be attached to the segments 108, which may then be assembled together. In some embodiments, the seal 107 may be added to the enclosure 112 after the segments 108 are assembled.

Any number of segments 108 may be assembled together. In some embodiments, two segments 108 may form a clam shell type enclosure. For example, as shown in FIG. 2A, the test article 104 may be positioned within a first segment 108 and a second segment 108 may be assembled with the first segment 108 to form the enclosure 112. The segments 108 may be assembled in a vertical or a horizontal orientation. For example, as shown in FIG. 2A, a second segment 108 may be positioned on top of the test article 104 and on top of a first segment 108. In other embodiments, as shown in FIG. 2B, the second segment 108 may be assembled in a lateral or horizontal direction relative to the first segment 108.

In some embodiments, the segments 108 shown in FIGS. 2A-2C may be segment sub-assemblies each made of smaller individual segments that have been attached together as described. In some embodiments, the segments 108 may be single, monolithic sheets bent or otherwise formed into the depicted, or other, shapes. For example, in FIG. 1A, each segment 108 may be a single sheet bent into shape as shown, or each segment 108 may be a subassembly of smaller, flat segments attached together.

FIG. 2C illustrates an example embodiment of three segments 108 being assembled together. The segments 108 include a hemisphere segment (left side of the figure, as oriented) and two quarter sphere segments (right side of the figure, as oriented). While two segments 108 are depicted in a segment subassembly, any number of segments 108 may be used for a subassembly. There may be two, three, four, five, six, seven, eight, nine, ten or more of the segments 108 in a segment subassembly. As described herein, the number of segments 108 and the shape and/or size of the segments may be dependent upon the outer shape of the test article 104. Further, the segments 108 may be rounded as shown. In some embodiments, the segments may be made up of flat sheets, such that the segments 108 appear rounded from a distance but are actually many-sided, polygonal structures that approximate the rounded outer contour of the test article 104.

FIGS. 3 and 4 are cross-sectional views of other embodiments of test systems 100 enclosing test articles 104. FIG. 3 is a cross-sectional schematic view of an embodiment of a customizable vacuum test system 100 having a rectangular cross-section with an interstitial region 116 and porous layer 132 located within the interstitial region 116 and test article 104 therein. FIG. 4 is a cross-sectional schematic view of an embodiment of a customizable vacuum test system 100 having a cylindrical cross-section and zonal barriers 120 within the interstitial region 116, without the test article 104 therein. Any of the systems 100 described herein with respect to FIGS. 1A-2C may have the same or similar features and/or functions as the systems 100 described herein with respect to FIGS. 3 and 4, and vice versa, except as otherwise described.

As shown in FIGS. 3 and 4, the segments 108 have been assembled about the test articles 104 to form the enclosure 112. The enclosure 112 conforms to the shape of the test article 104. The enclosure 112 may be configured to define an inner volume that is no more than 105 percent, no more than 110 percent, no more than 115 percent, no more than 120 percent, no more than 125 percent, no more than 130 percent, no more than 135 percent, no more than 140 percent, no more than 150 percent, of a volume occupied by the test article 104. The inner volume of the enclosure 112 may be the empty volume of the enclosure 112 and defined by inner surfaces 109 of the assembled segments 108. The volume occupied by the test article 104 may be defined by outer surfaces 105 of the test article 104, for example a volume of liquid that would be displaced by the test article 104 submerged in the liquid.

The systems 100 may include an interstitial region 116. The interstitial region 116 may be formed between the enclosure 112 and the test article 104 therein. The interstitial region 116 may be defined on a first side by the inner surfaces 109 of the segments 108 and on a second, opposing side by the outer surface or surfaces 105 of the test article 104. Thus, a channel or void may be formed surrounding the test article 104.

The interstitial region 116 may be sized such that the inner surface 109 of each segment 108 is no more than a maximum separation distance away from a respective outer surface 105 of the test article 104. This maximum separation distance, or an average of the maximum separation distances, may be no more than 6 inches, no more than 8 inches, no more than 10 inches, no more than 12 inches, no more than 14 inches, no more than 16 inches, no more than 18 inches, or no more than 24 inches. In some embodiments, the separation distance can be substantially constant across the interstitial region 116. In some embodiments, the separation distance can vary across the interstitial region 116.

A vacuum may be pulled within the interstitial region 116. The size and/or volume of the interstitial region 116 can determine the volume of air that may need to be pumped out of the system 100 during testing. The volume of air in the interstitial region 116 that may need to be pumped out of the system 100 may be several orders of magnitude less than that for a typical vacuum chamber facility. As such, the test time and cost are significantly reduced using the systems and methods described herein.

A porous layer 132 may be located within the interstitial region 116. The porous layer 132 may be positioned between the segments 108 and the test article 104. The porous layer 132 may be in contact with one or both of the inner surface 109 of the outer shell segments 108 and the outer surface 105 of the test article 104. The porous layer 132 may fill the entire interstitial region 116 or the porous layer 132 may partially fill the interstitial region 116. An outer envelope of the porous layer 132 (i.e., not counting any pores or voids within the porous layer 132) may fill at least 50%, at least 60%, at least 70%, at least 805, or at least 90% of the volume of the interstitial region 116.

The porous layer 132 may be configured to support the inner surface 109 of one or more of the segments 108 against an outer surface 105 of the test article 104. The porous layer 132 may provide structural support to the segments 108 due to counter inward forces due to pressure differentials on either side of the segments 108 after and during pulling of the vacuum in the interstitial region 116. The porous layer 132 may be foam or metal. In some embodiments, the porous layer 132 may comprise a honeycomb shape or configuration. For example, the porous layer 132 may comprise a metal honeycomb material. The pores or other openings in the porous layer 132 may extend in a generally radial direction. For example, elongated pores defined by honeycomb cells may have two opposing openings on either side that face respectively the test article 104 and the segments 108. There may be transverse or lateral openings in the porous layer 132. In some embodiments, the porous layer 132 may comprise solid, non-porous structural components spaced out within the interstitial region 116 to support the segments 108. In embodiments having zonal barriers 120 and zones 124, as further described, the porous layer 132 may be uniformly applied across all zones 124, or non-uniformly applied amongst the zones. The porous layer 132 can be applied in sheets or blown in. The porous layer 132 can be configured such that it is capable of supporting loads due to external pressure of 14.7 psi without deformation.

As shown in FIG. 4, the system 100 may include one or more zonal barriers 120. The zonal barriers 120 may be located within the interstitial region 116. The zonal barriers 120 may be partitions or other structures extending transversely from the inner surface 109 of the segment 108 to a corresponding outer surface 105 of the test article 104 and extending along the surfaces 109, 105 to form a fluidly separated zone 124 therebetween. The zonal barriers 120 may enclose the fluidly separated zone 124 such that the fluidly separated zone 124 is physically separated from the remaining interstitial region 116 or other fluidly separated zones 124. For example, a combination of the zonal barriers 120 and surfaces 109, 105 may surround the fluidly separated zone 124 on all sides. For example, the zonal barriers 120 may form sidewalls in the interstitial region, while the surfaces 109, 105 form top and bottom surfaces of the fluidly separated zones 124. In some embodiments, the surfaces 109, 105 can also form a portion of the sidewalls of the fluidly isolated zones 124 depending on the outer shape of the test article 104 or sealed enclosure 112.

Any number of zonal barriers 120 may be used. For example, two, three, four, five or more zonal barriers 120. The zonal barriers 120 may extend from the surfaces 109, 105 radially, upward, downward, other directions, or combinations thereof. For example, the zonal barriers 120 may extend along the length of the test article 104, along the width of the test article 104, or at an angle relative to the length or width of the test article 104. The zonal barriers 120 may extend a partial distance along the length, width, or angle relative to the length or width, or the entire distance.

The zonal barriers 120 may extend along contours of the test article 104. For example, the zonal barriers 120 may form fluidly separated zones 124 of various shapes such as shapes with at least three sides, at least four sides, at least five sides, at least six sides or more. The length, positioning, and/or shapes formed by the zonal barriers 120 may depend on the outer shape of the test article 104.

The zonal barriers 120 may form two or more fluidly separated zones 124. For example, one or more zonal barriers 120 may define two enclosed zones 124 by separating the interstitial region 116 into portions. Any number of zones 124 may be formed. For example, at least two, at least three, at least four, at least five, or more zones 124 may be formed. The zones 124 may vary in size or may be identical in size. The size of the zones 124 may depend on the orientation and length of the zonal barriers 120. A single zone 124 may be formed by at least one zonal barrier, at least two zonal barriers 120, at least three zonal barriers 120, at least four zonal barriers 120, or more. A zone 124 may be defined by zonal barriers 120 on all side surfaces within the interstitial region 116 of the zone 124 with the surfaces 109, 105 enclosing the zones 124 as top and bottom surfaces of the zone 124. A zone 124 may be defined by a combination of zonal barriers 120 and inner surfaces of the segments 108 as side surfaces, with the surfaces 109, 105 enclosing the zones 124 as top and bottom surfaces of the zones 124. For example, using a rectangular shaped test article 104 and sealed enclosure 112 for non-limiting, illustrative purposes, the zonal barriers 120 may extend linearly along the surfaces 109, 105 and eventually stop at an inner surface 109 of a segment 108 that extends generally perpendicular to that which the zonal barriers 120 were extending along. The generally perpendicular inner surface 109 may then define an end point of the zone 124.

In some embodiments, the zonal barriers 120 may be seals or similar materials. The zonal barriers 120 may be attached to the segments 108, for example prior to assembling the enclosure 112. In some embodiments, the zonal barriers 120 may be attached to the test article 104. The zonal barriers 120 may be configured to compress to fluidly seal off respective zones 124.

The zones 124 may be fluidly isolated from each other zone 124 such that each individual zone 124 can receive any leaking air from within the test article 104 and prevent migration of the leaking fluid to other zones 124. Sensors within the zones 124 may be used to locate any leaks. The zonal barriers 120 may thus form or isolate specific regions of the sealed enclosure 112, such that any locations of potential leaks may be more easily and accurately determined or identified, which can lead to more efficient and cost effective repairs to the test article 104.

The system 100 may include one or more of the sensors 128. At least one sensor 128 may be positioned in each zone 124. The sensor 128 may be configured to detect a leak in its corresponding zone 124. The sensor 128 may be configured to detect a change in pressure in the interstitial region 116 and/or the specific zone 124. The detected change in pressure may be used to determine if there is a leak of air from the test article 104. Example sensors 128 that may be used include pressure transducer sensors, imaging sensors, and thermal sensors. The porosity of the porous layer 132 may facilitate fluid communication of leaking gas with the sensors 128. The sensors 128 may be embedded in the porous layer 132, attached to the segments 108, attached to the test article 104, and/or located external to the enclosure 112.

As shown in FIG. 4, the system 100 may include a pump 136. The pump 136 may be a vacuum pump. The pump 136 may be configured to evacuate air from and create a vacuum within the interstitial region 116 and/or within the porous layer 132 during testing. One or more of the pressure sensors 128 can be used to measure a pressure change during and after creating a vacuum in the interstitial region 116 using the pump 136, as further described. As used herein, a "vacuum" has its usual and customary meaning and may include, without limitation, pressure readings no greater than 10 pounds per square inch (psi), no greater than 9 psi, no greater than 8 psi, no greater than 7 psi, no greater than 6 psi, no greater than 5 psi, no greater than 4 psi, no greater than 3 psi, no greater than 2 psi, no greater than 1 psi, no greater than 0.5 psi, no greater than 0.25 psi, no greater than 0.1 psi, no greater than 0.05 psi, no greater than 0.02 psi, or about 0 psi.

In some embodiments, the pump 136 may be a common vacuum pump that will evacuate air from more than one zone 124. Adjacent zones 124 may be in fluid communication with each other. The zonal barriers 120 may include an orifice connecting the zones 124 to allow for use of a common vacuum pump. The orifice may be one or more openings in the zonal barriers 120 that remain opened. In other embodiments, the orifice may include a valve or other structure responsive to pressure differences on either side of the zonal barrier 120. The single common pump 136 may thus be used to change the pressure across all zones 124. The one or more orifices may be sized and/or configured to allow for fluid flow between adjacent zones 124 while still allowing for identifying the particular zone 124 with any leaks. For example, the local rate of pressure change in one or more leaking zones 124 may be different from other zones 124 not having a leak, allowing for the detection and identification of the one or more zones 124 that have the leak. The use of a common vacuum pump across more than one zone 124 may allow for more rapid assessments and leak detection, and/or simplify assembly and testing by requiring less equipment and simpler configurations.

In some embodiments, the one or more pumps 136 may be used to independently evacuate air from each zone 124 for leak detection. Further, leak detection may be done in each zone 124, where adjacent zones 124 are not in fluid communication with each other. Independently assessing each zone 124 for leaks may improve the accuracy of detecting the rate of leak. For example, the improved accuracy may allow for the size of the penetration causing the leak to be calculated, which may be helpful for determining how to fix the leak.

The system 100 may be used at sea level to test articles 104 at sea level pressure levels, e.g., about 14.7 psi ambient pressure outside the system 100 and within the test article 104. Such tests may mimic environments where the internal pressure of the test article is 14.7 psi. Spacecraft may be operated with such internal pressures while in orbit or otherwise in space.

In circumstances where the test article 104 being tested is intended to be operated at a lower internal pressure than 14.7 psi, the same systems described herein may be used with modification to location or method of use. For example, the system 100 can be used at a higher elevation to perform the test. Some human space elements have used a working pressure of 10.2 psi, which could be facilitated by performing the test at an elevation of about 8,600 feet. In some instances, the systems and methods described herein may be used to test pressure integrity of pressure values with moderate MEOP (Maximum Expected Operating Pressure), such as propellant tanks operating at around 15-100 psi. With a suitable crush resistant material in the interstitial region 116, the system 100 may be lowered in a body of water until the vessel pressure is the same as the local hydrostatic pressure. For example, a 60 psi propellant tank encapsulated by a porous layer 132 and assembled segments 108, may be lowered in a body of water to a predetermined or desired depth. The tank internal pressure would be gradually raised as the system 100 is lowered in the water so the pressures are matched. At the desired depth, the porous layer 132 may be evacuated and the integrity of the inner test article 104 verified.

Figure 5:
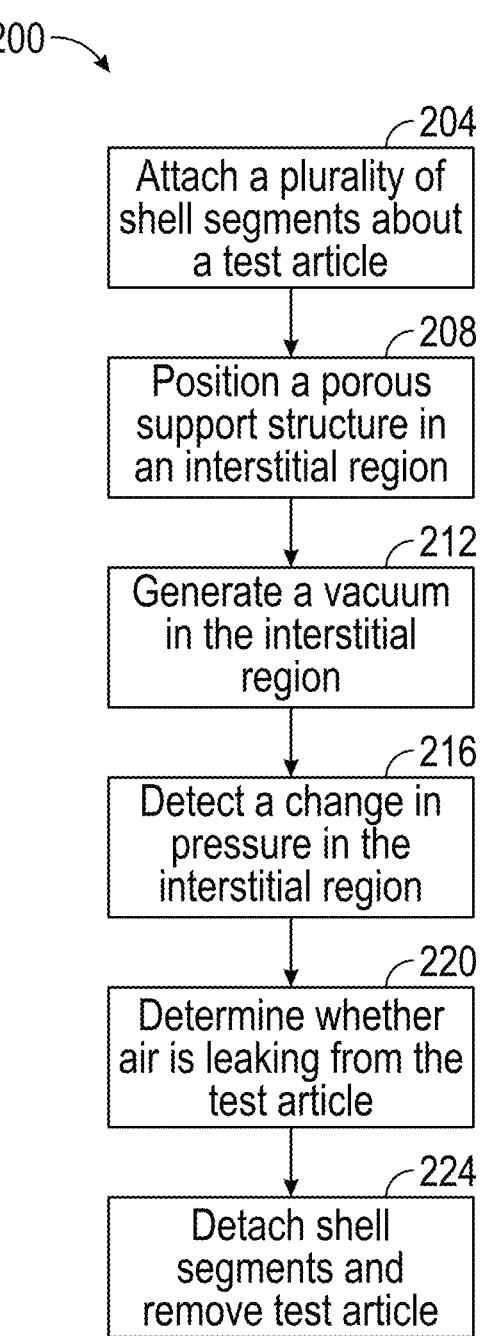
FIG. 5 is a flow chart illustrating an embodiment of a method for vacuum testing a test article using a customizable vacuum test system.

FIG. 5 is a flow chart illustrating an example method 200 for vacuum testing a test article (e.g., test article 104) using a customizable vacuum test system (e.g., test system 100). The method 200 may be performed by the systems 100 or variations thereof. The method 200 may be used with any of the systems 100 described herein with respect to FIGS. 1A-4.

The method 200 may begin with step 204 where a plurality of segments (e.g., segments 108) may be attached to each other about a test article (e.g., test article 104). The plurality of segments may be welded together. The plurality of segments may be mechanically coupled together, such as through the use of bolts or screws. In some embodiments, seals (e.g., seals 107) may be positioned about the edges of the outer shells segments before attaching the segments to each other. The seals may improve the overall seal of the assembled outer shell.

The method 200 may then move to step 208 where a porous layer or support structure (e.g., porous layer 132) may be positioned in an interstitial region (e.g., interstitial region 116). The porous layer or support structure may be prepositioned prior to any segments being assembled about the test article. The porous or support structure may be positioned during the assembly of the segments about the test article. The porous layer or support structure may be positioned between the test article and the segments. For example, the porous layer may contact the outer surface of the test article and the inner surface of the segments. In some embodiments, step 208 may further comprise positioning zonal barriers (e.g., zonal barriers 120) within the interstitial region 116 to form zones (e.g., zones 124). The zonal barriers may be positioned or formed prior to any segments being assembled about the test article. For example, by positioning the zonal barriers about the test article. The zonal barriers may be positioned or formed during the assembly of the segments about the test article. The porous layer may be positioned prior, during, or after the formation of the zonal barriers.

The method 200 may then move to step 212 where a vacuum may be generated within the interstitial region or the porous layer. A pump (e.g., pump 136) may be used to generate the vacuum. The vacuum can have a range of about 0 psi to about 14.7 psi. The vacuum being generated may be dependent upon the intended internal pressure of the test article.

The method 200 may then move to step 216 where a change in pressure over time in the interstitial region can be detected. The change in pressure may be detected using one or more sensors (e.g., sensor 128). The change in pressure may be detected in one or more fluidly isolated zones. The change may be discrete measurements taken at discrete times, or the change may be detected continually over time.

The method 200 may then move to step 220 where it can be determined whether or not air is leaking from the test article. A leak can be detected based on the pressures being detected. Vacuum testing may be used to evacuate air and create a vacuum around the test article to test for leaks of the pressurized air from within the test article by detecting pressure changes in the interstitial region. For example, a change in pressure over time may indicate an air leak. If the system being used has zonal barriers, a potential leak may be narrowed down to a specific zonal region. In some embodiments, a pressure transducer may be used. An electric signal may be generated as a function of the pressure imposed on the sensor. The sensor may be a force collector type of sensor, such as where a diaphragm, piston, bourdon tube, or bellows are used to measure strain or deflection due to applied force by the air over an area of the sensor. The one or more sensors may be a strain gauge, a piezoresistive strain gauge, a capacitive sensor, an electromagnetic sensor, a piezoelectric sensor, an optical sensor, a potentiometric sensor, a force balancing sensor, a resonant sensor, a thermal sensor, a thermal conductivity sensor such as a Pirani gauge, an acoustic sensor, other suitable sensors, or combinations thereof. In some embodiments, an acoustic sensor (e.g., microphone), detecting a temperature change, and/or performing an optical test (e.g., a "soap bubble" test) may be used alone or in combination with other methods to detect a leak. The sensor may be used to determine whether a detected pressure, or signal indicative of pressure, is above a specified threshold.

The method 200 may then move to step 224 where the one or more of the segments can be detached from each other to disassemble them. In some embodiments, all segments are detached such that they are in the same or substantially same condition as before they were assembled. In some embodiments, only the number of segments needed to create an opening large enough to remove or access the test article are detached. In some embodiments, the number of segments needed to expose a portion of the test article that may need repairs are detached such that the test article can be repaired and the segments reassembled for a second test. In some embodiments, the outer shell segments are detached in a way that the one or more of the outer shell segments can be reused and/or recycled.

Various modifications to the implementations described in this disclosure will be readily apparent to those skilled in the art, and the generic principles defined herein may be applied to other implementations without departing from the spirit or scope of this disclosure. Thus, the disclosure is not intended to be limited to the implementations shown herein but is to be accorded the widest scope consistent with the claims, the principles and the novel features disclosed herein. The word "example" is used exclusively herein to mean "serving as an example, instance, or illustration." Any implementation described herein as "example" is not necessarily to be construed as preferred or advantageous over other implementations, unless otherwise stated.

Certain features that are described in this specification in the context of separate implementations also may be implemented in combination in a single implementation. Conversely, various features that are described in the context of a single implementation also may be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Additionally, other implementations are within the scope of the following claims. In some cases, the actions recited in the claims may be performed in a different order and still achieve desirable results.

It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. A customizable vacuum test system comprising:

a plurality of outer shell segments each having an inner surface and an opposite outer surface, the plurality of outer shell segments configured to be assembled together, to conform to a shape of a test article and form a sealed enclosure about the test article, and to be disassembled from each other;

an interstitial region defined between an outer side of the test article and the inner surface of the plurality of outer shell segments when the plurality of outer shell segments form the sealed enclosure about the test article;

a porous layer configured to be located within the interstitial region and to support the inner surface of one or more of the plurality of outer shell segments against an outer side of the test article when the plurality of outer shell segments form the sealed enclosure about the test article; and a pump in fluid communication with the interstitial region and configured to evacuate air from within the interstitial region to create a vacuum in the interstitial region.

2. The system of claim 1, wherein the plurality of outer shell segments are configured to be welded together when assembled to form the sealed enclosure.

3. The system of claim 1, further comprising a seal configured to extend along opposing outer edges of two adjacent shell segments of the plurality of outer shell segments.

4. The system of claim 1, wherein the porous layer comprises a honeycomb configuration.

5. The system of claim 1, further comprising one or more sensors configured to detect a change in pressure in the interstitial region.

6. The system of claim 1, further comprising one or more zonal barriers configured to define two or more zones within the interstitial region that are fluidly isolated from each other.

7. The system of claim 6, further comprising a sensor positioned in one or more of the fluidly isolated zones configured to detect a leak of air from within the test article to the respective fluidly isolated zone.

8. The system of claim 1, wherein the sealed enclosure is configured to provide a volume that is no more than 130% of a volume occupied by the test article.

9. The system of claim 1, wherein the sealed enclosure does not include a door.

10. The system of claim 1, wherein the vacuum comprises a pressure no greater than 1 psi.

11. A method of vacuum testing a test article, the method comprising:

attaching a plurality of shell segments to form a sealed enclosure about the test article, wherein the test article comprises a volume of air therein;

positioning a porous support structure in an interstitial region defined between the test article and an inner side of the sealed enclosure;

generating a vacuum within the interstitial region;

detecting a change in pressure in the interstitial region with one or more sensors;

determining whether the volume of air is leaking from the test article; and detaching one or more of the plurality of shell segments from each other to allow the test article to be removed or accessed.

12. The method of claim 11, wherein attaching the plurality of shell segments comprises welding the plurality of shell segments together.

13. The method of claim 11, wherein attaching the plurality of shell segments comprises substantially conforming the sealed enclosure to an outer shape of the test article.

14. The method of claim 11, further comprising fluidly isolating one or more zones of the interstitial region with a zonal barrier.

15. The method of claim 14, further comprising determining whether the volume of air is leaking from the test article into the one or more zones.

16. The method of claim 11, wherein the sealed enclosure forms a volume that is no more than 130% of a volume occupied by the test article.

17. The method of claim 11, further comprising positioning the plurality of shell segments about the test article such that an average distance between inner surfaces of the plurality of shell segments and respective opposing outer surfaces of the test article is no more than 10 inches.

*    *    *    *    *